(12) United States Patent
Miyagawa et al.

(10) Patent No.: US 11,326,963 B2
(45) Date of Patent: May 10, 2022

(54) ISOLATED SIGNAL TRANSMISSION DEVICE AND ELECTRONIC APPARATUS

(71) Applicant: DENSO WAVE INCORPORATED, Aichi-Pref. (JP)

(72) Inventors: Hiroki Miyagawa, Chita-gun (JP); Masahiro Kamiya, Chita-gun (JP)

(73) Assignee: DENSO WAVE INCORPORATED, Aichi-Pref. (JP)

(*) Notice: Subject to any disclaimer, the term of this patent is extended or adjusted under 35 U.S.C. 154(b) by 3 days.

(21) Appl. No.: 15/696,565

(22) Filed: Sep. 6, 2017

(65) Prior Publication Data

US 2018/0073939 A1 Mar. 15, 2018

(30) Foreign Application Priority Data

Sep. 12, 2016 (JP) .............................. JP2016-177606

(51) Int. Cl.
| | |
|---|---|
| *H05K 1/18* | (2006.01) |
| *G01K 13/00* | (2021.01) |
| *G01K 7/04* | (2006.01) |

(52) U.S. Cl.
CPC .............. *G01K 13/00* (2013.01); *G01K 7/04* (2013.01); *H05K 1/181* (2013.01); *H05K 2201/10022* (2013.01); *H05K 2201/10151* (2013.01)

(58) Field of Classification Search
CPC .......... G01K 13/00; G01K 7/04; H05K 1/181; H05K 2201/10022; H05K 2201/10151
USPC ......................................................... 307/145
See application file for complete search history.

(56) References Cited

U.S. PATENT DOCUMENTS

| | | | | |
|---|---|---|---|---|
| 5,827,960 | A * | 10/1998 | Sultan ..................... | G01F 1/684 73/204.26 |
| 6,294,787 | B1 * | 9/2001 | Schieferdecker ......... | G01J 5/02 250/349 |
| 2003/0002899 | A1 * | 1/2003 | Furukawa ............ | B41J 2/04541 400/120.01 |
| 2007/0195066 | A1 * | 8/2007 | Bernitz .................. | G01K 7/186 345/174 |
| 2008/0047339 | A1 * | 2/2008 | Hasebe ................... | G01F 1/684 73/204.17 |
| 2008/0143319 | A1 * | 6/2008 | Breakenridge ........ | G01R 21/04 324/95 |
| 2008/0197274 | A1 * | 8/2008 | Harder ................ | H01L 31/0203 250/238 |
| 2010/0132452 | A1 * | 6/2010 | Sakuma ................ | G01F 1/6845 73/204.26 |

(Continued)

FOREIGN PATENT DOCUMENTS

| | | |
|---|---|---|
| JP | S57-034296 A | 2/1982 |
| JP | 2007-181034 A | 7/2007 |
| JP | 2010-281576 A | 12/2010 |

*Primary Examiner* — Daniel Cavallari
*Assistant Examiner* — Brian K Baxter
(74) *Attorney, Agent, or Firm* — Oliff PLC (57) ABSTRACT

An isolated signal transmission device includes a resistor element and a heat flow sensor. The resistor element generates heat as a result of a current based on an inputted signal being applied to the resistor element. The heat flow sensor is provided such as to be electrically isolated from the resistor element. The heat flow sensor detects an amount of heat flowing to the heat flow sensor itself when the resistor element generates heat. The heat flow sensor outputs a signal based on the detected amount of heat.

6 Claims, 4 Drawing Sheets

(56) References Cited

U.S. PATENT DOCUMENTS

| | | | |
|---|---|---|---|
| 2012/0247641 A1* | 10/2012 | Ruggiero | H05B 3/26 |
| | | | 156/60 |
| 2013/0145840 A1* | 6/2013 | Asano | G01F 1/6845 |
| | | | 73/204.25 |
| 2013/0199280 A1* | 8/2013 | Nakano | G01F 1/6842 |
| | | | 73/114.34 |
| 2014/0334521 A1* | 11/2014 | Wu | G01K 7/32 |
| | | | 374/170 |
| 2015/0377732 A1* | 12/2015 | Minami | G01L 21/12 |
| | | | 73/31.04 |
| 2016/0095182 A1* | 3/2016 | Bjorn | H05B 37/0218 |
| | | | 315/149 |
| 2017/0023389 A1* | 1/2017 | Hidaka | G01F 5/00 |
| 2017/0176263 A1* | 6/2017 | Chen | G01K 7/24 |
| 2017/0254686 A1* | 9/2017 | Royhob | G01F 1/69 |
| 2017/0268951 A1* | 9/2017 | Chen | G01L 21/12 |
| 2018/0199872 A1* | 7/2018 | Ito | A61B 5/1491 |
| 2019/0170556 A1* | 6/2019 | Ikeno | G01F 1/696 |
| 2019/0232292 A1* | 8/2019 | Stein | B01L 7/04 |

* cited by examiner

ISOLATED SIGNAL TRANSMISSION DEVICE AND ELECTRONIC APPARATUS

CROSS-REFERENCE TO RELATED APPLICATIONS

This application is based on and claims the benefit of priority from Japanese Patent Application No. 2016-177606, filed Sep. 12, 2016. The entire disclosure of the above application is incorporated herein by reference.

BACKGROUND

Technical Field

The present disclosure relates to an isolated signal transmission device that isolates a signal and transmits the signal, and an electronic apparatus.

Related Art

Conventionally, many electronic apparatuses including industrial apparatuses such as programmable logic controllers (referred to, hereafter, as PLCs) are provided with a signal transmission device or, simply put, an input circuit. The signal transmission device transmits a signal provided by an external device, such as a switch or a sensor, to an internal circuit. In addition, many electronic apparatuses, of which an example herein is industrial apparatuses, require electrical isolation from the internal circuit. For example, in JP-A-2007-181034, an isolated signal transmission device configured by a photocoupler is used.

However, industrial apparatuses are required to meet various safety standards. For example, in the isolated signal transmission device, measures, such as an area that is not provided with a circuit pattern being set in a section in which an insulator is not interposed, are required to ensure isolation from the internal circuit. Therefore, in the isolated signal transmission device that uses a photocoupler, required space on a substrate surface tends to be large. Consequently, the size of the substrate may become large, the addition of new functions may be restricted due to insufficient space, and the like.

SUMMARY

It is thus desired to provide an isolated signal transmission device that can be reduced in size.

A first exemplary embodiment provides an isolated signal transmission device including: a resistor element that generates heat as a result of a current based on an inputted signal being applied to the resistor element; and a heat flow sensor that is provided such as to be electrically isolated from the resistor element, which detects an amount of heat flowing to the heat flow sensor itself when the resistor element generates heat, and outputs a signal based on the detected amount of heat. That is, an isolated signal transmission device uses a heat flow sensor that is typically used for temperature detection in an output stage. As a result, the isolated signal transmission device can transmit a signal between a resistor element serving as an input side and the heat flow sensor serving as an output side in an electrically isolated state by heat conduction.

As a result, for example, transmission of signals from a front surface to a back surface of a substrate, which is not possible or very difficult by a photocoupler, can be performed. At this time, the resistor element generates heat as a result of energization. Therefore, a plurality of circuit components, such as a drive circuit of the photocoupler, is not required. Consequently, space required for mounting on the substrate can be reduced. In addition, signal transmission is performed by heat. Therefore, housing of a transmission source inside a package that blocks disturbances, such as that required when signal transmission is performed by light, is not required. This also contributes to size reduction.

Furthermore, signal transmission by heat realizes performance regarding transmission speed and transmission accuracy that favorably compares to signal transmission based on light such as that by a photocoupler, when consideration is given to the fact that the materials, thickness, and the like of members used for substrates tend to easily transmit heat in the first place. Therefore, forming an isolated circuit of an electronic apparatus to have a configuration in which heat is transmitted enables size reduction to be achieved without causing reduction in the performance of the isolated circuit as an electronic component. Consequently, the isolated signal transmission device can be reduced in size.

The first exemplary embodiment may further include a substrate that is configured by an insulating material, the substrate being interposed between the resistor element and the heat flow sensor. That is, insulation between the resistor element and the heat flow sensor may be provided by the substrate. The substrate is necessary for mounting of electronic components, such as the resistor element and the heat flow sensor. As a result of the substrate being interposed between the resistor element and the heat flow sensor, electrical insulation between the resistor element and the heat flow sensor can be achieved without an additional component being required. Consequently, increase in circuit size does not occur.

In the first exemplary embodiment, the resistor element may be mounted on a surface of the substrate. The heat flow sensor may be embedded inside the substrate, which is configured by an insulating material, such as to correspond to a mounting position of the resistor element. As a result, space for mounting the heat flow sensor is no longer required to be provided on the surface of the substrate. Consequently, space occupied by the isolated signal transmission device can be reduced and the substrate can be reduced in size.

In addition, reduction of the space occupied by the isolated signal transmission device means that, when the substrate size is the same, space for mounting other circuit components can be secured. Therefore, other circuit components can be provided for addition of functions. Consequently, size reduction or multi-functionality of the isolated signal transmission device can be achieved. Of course, because the substrate which is an insulator is interposed between the resistor element and the heat flow sensor, electrical isolation is achieved.

In the first exemplary embodiment, the isolated signal transmission device may include a metal component on a side opposite the resistor element with the heat flow sensor therebetween. When a signal is transmitted by heat transfer, it can be considered that the accuracy of signal transmission can be improved by the heat being sent towards the heat flow sensor. Meanwhile, to ensure electrical isolation, a metal component or the like that has high heat conductivity is preferably not arranged between the resistor element and the heat flow sensor.

Therefore, the metal component that has relatively high heat conductivity compared to the substrate is provided on the side opposite the resistor element with the heat flow sensor therebetween. As a result, a flow of heat from the resistor element towards the metal component, that is, a flow of heat that reaches the metal component from the resistor element via the heat flow sensor can be formed within the substrate. As a result, heat generated by the resistor element can be concentrated on the heat flow sensor, and the heat flow attributed to heat generated by the resistor element can be accurately detected. Furthermore, when the heat flow can be accurately detected, the accuracy of signal transmission, that is, the signal-to-noise (S/N) ratio can be improved.

In the first exemplary embodiment, a plurality of resistor elements and heat flow sensors may be provided on the substrate. A separation area that divides the metal component is provided such as to be positioned between adjacent heat flow sensors. When a plurality of isolated signal transmission devices are provided to handle a plurality of inputs, arranging the resistor elements and the heat flow sensors such as to be adjacent to each other can be considered in order to save space. When a resistor element generates heat, the heat is considered to spread in a circumferential direction around the resistor element that has generated the heat. That is, heat not only from the paired resistor element, but also from an adjacent resistor element positioned nearby may be transmitted to the heat flow sensor.

At this time, when the heat flow sensor detects heat flow from a resistor element other than the paired resistor element, a signal from another channel becomes mixed. Therefore, as a result of the separation area that divides the metal component being provided, heat from another resistor element positioned nearby can be suppressed from mixing with the heat flow from the paired resistor element. That is, mixing of a signal from another channel can be suppressed.

In the first exemplary embodiment, the isolated signal transmission device may use a ground pattern provided on the substrate as the metal component. The heat flow sensor outputs a voltage based on a temperature difference generated in the heat flow sensor itself. At this time, when the temperature difference generated in the heat flow sensor itself is small, the outputted voltage is also low. That is, when the periphery of the heat flow sensor becomes the same temperature, even when the temperature itself is high, the outputted voltage becomes low.

Meanwhile, the ground pattern is a circuit pattern through which a current circulates. Therefore, the ground pattern is formed over a wide area as a so-called solid filling, or such as to have a thick pattern width. Consequently, when heat is transmitted to the ground pattern, the ground pattern is not immediately saturated with heat. In addition, the ground pattern is often provided on a substrate surface and is considered to be capable of easily discharging transmitted heat.

Therefore, as a result of the ground pattern being used as the metal component, heat that has passed through the heat flow sensor can be efficiently discharged from the ground pattern. Consequently, the flow of heat passing through the heat flow sensor is promoted. A sufficient temperature difference can be generated in the heat flow sensor, between the resistor element side and the ground pattern side. Therefore, the accuracy of signal transmission can be improved.

A second exemplary embodiment provides an electronic apparatus including an isolated signal transmission device. The isolated signal transmission device includes: a resistor element that generates heat as a result of a current based on an inputted signal being applied to the resistor element; and a heat flow sensor that detects an amount of heat flowing to the heat flow sensor itself when the resistor element generates heat, and outputs a signal based on the detected amount of heat. In this case, the isolated signal transmission device can be reduced in size as described above. Therefore, size reduction of the substrate or mounting of other circuits can be performed. Consequently, size reduction and multi-functionality of industrial apparatuses can be achieved.

DESCRIPTION OF THE EMBODIMENTS

First Embodiment

A first embodiment will hereinafter be described with reference to FIGS. 1 to 4.

Figure 1:
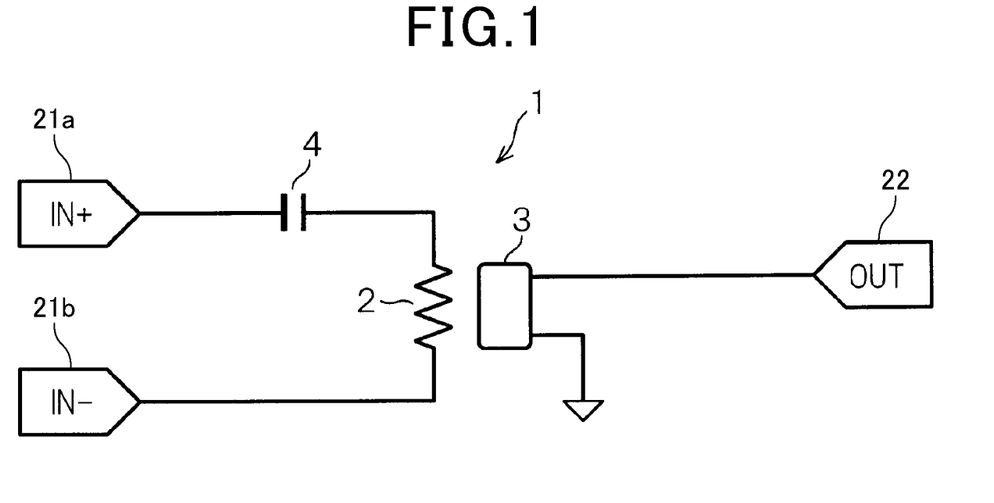
FIG. 1 is a schematic diagram of an electrical configuration of a transmission device according to an embodiment.

As shown in FIG. 1, an isolated signal transmission device (referred to, hereafter, as simply a transmission device 1) according to the present embodiment includes a resistor element 2 and a heat flow sensor 3. The transmission device 1 isolates a signal inputted from a connection terminal 6 (see FIG. 2) and transmits the signal to an internal circuit 7 (see FIG. 2). According to the present embodiment, an alternating-current signal is presumed as the inputted signal.

The resistor element 2 is provided in series between terminals 21a and 21b for the inputted signal indicated by IN+ and IN− in FIG. 1. In addition, a capacitor 4 is provided in series with the resistor element 2. Therefore, when the alternating-current signal is inputted, a current flows to the resistor element 2. The resistor element 2 generates heat as a result of the current. That is, the transmission device 1 includes the resistor element 2 that generates heat as a result of a current based on the inputted signal being applied to the resistor element 2. According to the present embodiment, a surface-mounted type is used as the resistor element 2.

For example, the heat flow sensor 3 is configured by a resin material and formed into a thin, rectangular film-like shape. The heat flow sensor 3 detects heat flow that flows to the heat flow sensor 3 itself. Specifically, different types of metal (for example, a combination of copper and constantan) are arranged such as to be connected to each other inside the heat flow sensor 3. When heat flow is generated in a thickness direction D1 (see FIG. 3) of the heat flow sensor 3, according to the present embodiment, a temperature difference occurs between a front surface and a back surface of the heat flow sensor 3. The heat flow sensor 3 converts the temperature difference to a voltage as a result of the Seebeck effect. Then, the heat flow sensor 3 outputs the voltage based on the temperature difference generated by the amount of heat. In the present embodiment, the outputted voltage is transmitted to the internal circuit 7 in FIG. 2 via a terminal 22 for the outputted signal indicated by OUT in FIG. 1.

While the details of the heat flow sensor 3 will be described hereafter with reference to FIG. 3, the heat flow sensor 3 is provided near the resistor element 2 and is electrically isolated from the resistor element 2. Therefore, when the resistor element 2 generates heat, the heat passes through the heat flow sensor 3. As a result, the heat flow sensor 3 outputs a voltage based on the heat generated by the resistor element 2. The heat flow sensor 3 outputs a voltage based on the area of a detection area. Therefore, should the area of the detection area be determined, heat flux indicating the amount of heat flowing per unit area can be detected. Thus, the heat flow sensor 3 is also referred to as a heat flux sensor.

In this case, the current continues to flow to the resistor element 2 while the alternating-current signal is being inputted. Therefore, the resistor element 2 continues to generate heat at, for example, a temperature near 100 degrees. At this time, because the amount of heat flowing to the heat flow sensor 3 is large, a relatively large voltage value is outputted. Meanwhile, when the alternating-current signal is no longer inputted, the current does not flow to the resistor element 2. Therefore, the temperature of the resistor element 2 becomes a temperature near ambient temperature. At this time, the amount of heat flowing to the heat flow sensor 3 becomes small. Alternatively, no heat flows to the heat flow sensor 3. As a result, a relatively small voltage value is outputted.

Therefore, for example, a threshold is set for the output voltage of the transmission device. When a state in which the alternating-current signal is being inputted is an ON state and a state in which the alternating-current signal is not being inputted is an OFF state, for example, an ON/OFF state of a switch or the like can be transmitted. Alternatively, the amount of heat generated by the resistor element 2 can be adjusted by the alternating-current signal being intermittently inputted. As a result, the state of an external apparatus can be transmitted not only as the two levels ON and OFF, but also as a plurality of levels or in a continuous manner. That is, the transmission device 1 according to the present embodiment transmits a signal by functioning as an alternating-current-to-direct-current converting device.

Figure 2:
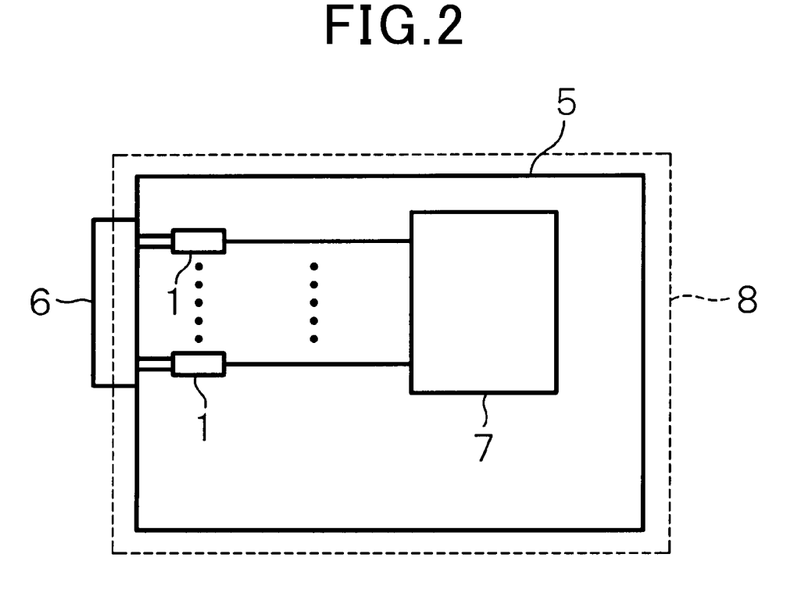
FIG. 2 is a schematic diagram of an electrical configuration of a PLC serving as an industrial apparatus including the transmission device according to the first embodiment.

As shown in FIG. 2, a plurality of transmission devices 1 are mounted on a substrate 5. The substrate 5 is configured by an insulating material such as glass epoxy. In addition, the substrate 5 is generally formed such as to have a thickness of about 1.6 mm. Therefore, the substrate 5 has a structure that facilitates heat transmission into the substrate 5. The connection terminal 6 and the internal circuit 7 are mounted on the substrate 5. The connection terminal 6 is a connector, a terminal block, or the like that is connected to an external apparatus. Various signals are inputted and outputted to and from the connection terminal 6. The internal circuit 7 is configured to include a power supply circuit, a microcomputer, and the like (not shown).

According to the present embodiment, the substrate 5 is provided inside a main unit of a programmable logic controller (referred to, hereafter, as PLC 8) that serves as an industrial apparatus. Such industrial apparatuses are used in robot controllers, motor controllers, and the like.

Next, workings of the above-described configuration will be described.

As described above, in the case of a conventional isolated signal transmission device using a photocoupler (referred to, hereafter, as a conventional device, for convenience), measures, such as setting of an area that is not provided with a circuit pattern, are required in order to meet safety standards. Therefore, in the conventional device, the required space tends to be large. The size of the substrate may become large, the addition of new functions may be restricted due to insufficient space on the substrate, and the like.

Therefore, according to the present embodiment, size reduction of the transmission device 1 is achieved in the following manner.

Figure 3:
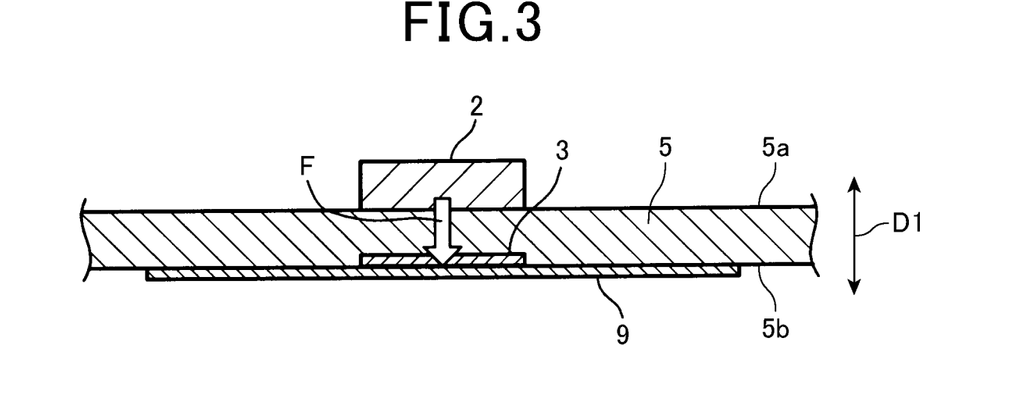
FIG. 3 is a schematic diagram of a mounting aspect of the transmission device shown in FIG. 1 to a substrate.

As shown in FIG. 3, the resistor element 2 of the transmission device 1 is surface-mounted on one surface of the substrate 5. Hereafter, for convenience, the side on which the resistor element 2 is mounted is referred to in the description as a top surface (front surface) 5a of the substrate 5. The surface on the opposite side is referred to as a bottom surface (back surface) 5b of the substrate 5.

Meanwhile, the heat flow sensor 3 is embedded inside the substrate 5 configured by an insulating material, in correspondence with the mounting position of the resistor element 2. More specifically, the heat flow sensor 3 is provided in a position that is below the mounting position of the resistor element 2, and such that at least a portion thereof overlaps the resistor element 2 in a transparent view from the top surface 5a side of the substrate 5. In addition, the heat flow sensor 3 is provided in a state in which an insulator, that is, the substrate 5 is interposed between the heat flow sensor 3 and the resistor element 2. Moreover, the heat flow sensor 3 is provided in a position at which the distance from the resistor element 2 is equal to or less than the thickness of the substrate 5, that is, near the resistor element 2.

As a result, the required space on the top surface 5a of the substrate 5 substantially matches the size of the resistor element 2. At this time, a single capacitor 4 is required for the resistor element 2 to generate heat in the transmission device 1. Therefore, compared to a drive circuit of the photocoupler in the conventional device, the circuit scale significantly decreases in the transmission device 1.

In addition, heat is transmitted even in the substrate 5 that is configured by an insulating material. Therefore, when the resistor element 2 generates heat, the heat flows through the heat flow sensor 3 as indicated by arrow F. At this time, the heat flow sensor 3 is provided near the resistor element 2. Therefore, the heat flow sensor 3 can accurately detect the heat flow attributed to the heat generated by the resistor element 2.

In addition, the voltage based on the detected amount of heat is outputted from the heat flow sensor 3 to the internal circuit 7. Therefore, the internal circuit 7 can detect whether or not the resistor element 2 is generating heat, that is, whether or not the alternating-current signal, according to the present embodiment, is being applied. That is, the transmission device 1 actualizes isolation by heat conduction, rather than isolation by light as in the conventional apparatus. The substrate 5 is used as a transmission path for heat. As a result, the signal inputted to the transmission device 1 can be transmitted to the internal circuit 7 side in an electrically isolated state.

In addition, according to the present embodiment, a metal component is provided in the substrate 5 on the side opposite the resistor element 2, that is, on the back surface side of the substrate 5 with the heat flow sensor 3 therebetween. According to the present embodiment, the metal member is provided such as to be in contact with the heat flow sensor 3. In addition, according to the present embodiment, a ground pattern 9 formed on the back surface of the substrate 5 is used as the metal component. Here, the ground pattern 9 is a metal component that serves to stabilize ground potential and is provided on the substrate 5 over a wide area as a so-called solid filling, or as a wiring pattern having a thick line width. That is, according to the present embodiment, the metal component is formed into a thin plate-like shape, that is, a layer-like shape that can be and is easily provided on the surface of the substrate 5 and or inside the substrate 5.

In other words, the metal component that more easily transmits heat than the substrate 5 is arranged beyond the heat flow sensor 3 in the direction from the resistor element 2 towards the heat flow sensor 3. As a result, heat flow is led from the resistor element 2 in the direction towards the heat flow sensor 3, and heat generation by the resistor element 2 is more easily detected.

Furthermore, the ground pattern 9 is provided such that the surface thereof is exposed. As a result, heat release from the surface of the ground pattern 9 is promoted. The temperature difference between both surfaces of the heat flow sensor 3 in the thickness direction D1 increases. The voltage that is outputted increases as the temperature difference increases. Therefore, the S/N ratio can be improved, and signal transmission of a higher accuracy can be performed.

Figure 4:
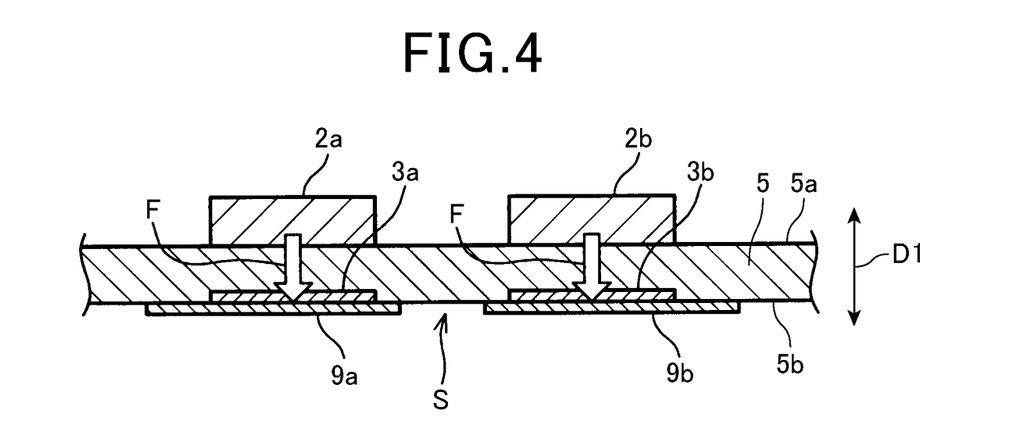
FIG. 4 is a schematic diagram of a mounting aspect of the transmission device shown in FIG. 2 to a substrate.

In addition, according to the present embodiment, a plurality of transmission devices 1 are provided on the substrate 5, as described above. In this case, when the metal component is the ground pattern 9, heat flow from an adjacent resistor element 2 may be detected. Therefore, as shown in FIG. 4, a separation area (S) that divides the ground pattern 9 is provided between adjacent heat flow sensors 3.

According to the present embodiment, the separation area (S) is formed in the ground pattern 9, which is widely formed on the bottom surface 5*b* of the substrate 5, between the heat flow sensors 3 that are arranged to be adjacent to each other. The separation area (S) is formed into a groove shape that is about as long as the adjacent sides of the heat flow sensors 3. As a result, heat from a resistor element 2*a* arranged on the substrate 5 passes through a heat flow sensor 3*a* and is then released from a ground pattern 9*a* portion. In addition, heat from a resistor element 2*b* adjacent to the resistor element 2*a* passes through a heat flow sensor 3*b* and is released from a ground pattern 9*b* portion.

As a result, even when a plurality of heat flow sensors 3 are provided, the flow of heat from each resistor element 2 can be concentrated on the corresponding heat flow sensor 3. Therefore, heat from another resistor element 2 positioned near the heat flow sensor 3, such as an adjacent resistor element 2, can be suppressed from mixing with the heat flow from the corresponding resistor element 2. That is, mixing of a signal from another channel can be suppressed. In this case, the separation area (S) can be provided in a shared ground pattern 9 as described above. However, a structure in which the separation area (S) is present as a result of separate solid fillings that are not electrically connected or a relatively thick circuit pattern being used as the metal component is also possible.

As a result of the above-described configuration, effects such as the following can be achieved.

The transmission device 1 includes the resistor element 2 and a heat flow sensor 3. The resistor element 2 generates heat as a result of a current based on an inputted signal being applied to the resistor element 2. The heat flow sensor 3 is provided such as to be electrically isolated from the resistor element 2. The heat flow sensor 3 detects the amount of heat flowing to the heat flow sensor 3 itself when the resistor element 2 generates heat, and outputs a signal based on the detected amount of heat. That is, the resistor element 2 as an isolated circuit configures an input circuit in the transmission device 1. The heat flow sensor 3 configures an output circuit that is electrically isolated from the input circuit.

As a result, a signal can be transmitted by heat conduction, that is, in an electrically isolated state, between the resistor element 2 serving as an input side and the heat flow sensor 3 serving as an output side in the transmission device 1. In other words, the heat flow sensor 3 that is typically presumed to detect temperature is used as a signal transmitting element that transmits a signal by heat conduction. As a result, for example, transmission of signals on a path that is not possible or very difficult by a photocoupler, such as transmission of signals from the front surface to the back surface of the substrate 5, can be performed.

Furthermore, signal transmission by heat realizes performance regarding transmission speed and transmission accuracy that favorably compares to signal transmission based on light such as that by a photocoupler, when consideration is given to the fact that the materials, thickness, and the like of members used for substrates tend to easily transmit heat in the first place. Therefore, forming an isolated circuit of an electronic apparatus to have a configuration in which heat is transmitted enables size reduction to be achieved without causing reduction in the performance of the isolated circuit as an electronic component.

In addition, when the resistor element 2 is energized, that is, when a current flows to the resistor element 2, the resistor element 2 generates heat. Therefore, unlike the photocoupler, a drive circuit configured by a plurality of circuit components is basically not required. Consequently, required space on the substrate 5 can be reduced. As a result, the transmission device 1 can be reduced in size.

In the transmission device 1, the resistor element 2 is mounted on the surface of the substrate 5. The heat flow sensor 3 is embedded within the substrate 5, which is configured by an insulating material, in a position corresponding to the mounting position of the resistor element 2. As a result, space for mounting the heat flow sensor 3 is no longer required to be provided on the surfaces, that is, the above-described top surface 5*a* and bottom surface 5*b* of the substrate 5. As a result, the space occupied by the transmission device 1 can be reduced. The substrate 5 can be reduced in size.

In addition, reduction of the space occupied by the transmission device 1 means that space for mounting other circuit components can be secured. Therefore, addition of functions can be facilitated. Consequently, size reduction or multi-functionality of the transmission device 1 can be achieved. Of course, because the substrate 5 which is an insulator is interposed between the resistor element 2 and the heat flow sensor 3, electrical isolation is achieved.

The transmission device 1 includes the metal component on the side opposite the resistor element 2 with the heat flow sensor 3 therebetween. When a signal is transmitted by heat transfer, it can be considered that the accuracy of signal transmission can be improved by the heat being sent towards the heat flow sensor 3. Meanwhile, to ensure electrical isolation, a metal component or the like that has high heat conductivity is preferably not arranged between the resistor element 2 and the heat flow sensor 3.

Therefore, the metal component that has relatively high heat conductivity compared to the substrate 5 is provided on the side opposite the resistor element 2 with the heat flow sensor 3 therebetween. As a result, a flow of heat from the resistor element 2 towards the metal component, that is, a flow of heat that reaches the metal component from the resistor element 2 via the heat flow sensor 3 can be formed within the substrate 5. Therefore, the heat flow sensor 3 can accurately detect heat generation by the resistor element 2, and the accuracy of signal transmission, that is, the S/N ratio can be improved.

Furthermore, according to the present embodiment, the metal component is provided such as to be in contact with the heat flow sensor 3. Therefore, the transmission of heat from the heat flow sensor 3 to the metal component is promoted. Temperature difference between an entrance side and an exit side of the heat flow sensor 3 is easily generated. Transmission accuracy can thereby be improved.

In the transmission device 1, a plurality of resistor elements 2 and heat flow sensors 3 are provided on the substrate 5. The separation area (S) that divides the metal component is provided such as to be positioned between adjacent heat flow sensors 3. When a plurality of transmission devices 1 are provided to handle a plurality of inputs, arranging the resistor elements 2 and the heat flow sensors 3 such as to be adjacent to each other can be considered in order to save space.

At this time, when the resistor element 2 generates heat, the heat is considered to spread in a circumferential direction around the resistor element 2. Therefore, heat not only from the paired resistor element 2 but also from an adjacent resistor element 2 positioned nearby may be transmitted to the heat flow sensor 3. When the heat flow sensor 3 detects the heat flow from a resistor element 2 other than the paired resistor element 2, a signal from another channel becomes mixed.

Therefore, as a result of the separation area (S) that divides the metal component being provided, heat from another resistor element 2 positioned nearby can be suppressed from mixing with the heat flow from the paired resistor element 2. That is, mixing of a signal from another channel can be suppressed.

The transmission device 1 uses the ground pattern 9 provided on the substrate 5 as the metal component. As described above, the heat flow sensor 3 outputs a voltage based on the temperature difference in the thickness direction D1 according to the present embodiment. Therefore, the output is low when the temperature difference is small. That is, when the periphery of the heat flow sensor 3 becomes the same temperature, even when the temperature itself is high, the outputted voltage value is low.

Meanwhile, the ground pattern 9 is formed as a circuit pattern through which a current circulates, over a wide area as the so-called solid filling or such as to have a thick line width. Therefore, saturation does not easily occur even when heat is transmitted. In addition, because the ground pattern 9 tends to be provided on the surface of the substrate 5, it is considered that the transmitted heat can be easily discharged outside of the substrate 5.

Furthermore, the ground pattern 9 extends to a section in which other electric components, in addition to the heat flow sensor 3, are arranged. Therefore, heat generated by other electronic components flow to the ground pattern 9. As a result, heat from other electronic components does not easily mix with the heat received by the heat flow sensor 3 from the resistor element 2. Consequently, detection accuracy of the heat flow sensor 3, that is, the signal transmission accuracy can be improved.

Here, as a result of the ground pattern 9 being used as the metal component, heat that has passed through the heat flow sensor 3 can be efficiently discharged from the ground pattern 9. Consequently, the flow of heat passing through the heat flow sensor 3 is promoted. A sufficient temperature difference can be generated in the heat flow sensor 3, between the resistor element 2 side and the ground pattern 9 side. Therefore, the accuracy of signal transmission can be improved.

In addition, an electronic apparatus that includes the transmission device 1 that has the resistor element 2 that generates heat as a result of a current based on an inputted signal being applied to the resistor element 2, and the heat flow sensor 3 that detects the amount of heat flowing to the heat flow sensor 3 itself when the resistor element 2 generates heat and outputs a signal based on the detected amount of heat can achieve the above-described effects. Size reduction and multi-functionality can be achieved. For example, the electronic apparatus is an industrial apparatus such as the PLC 8 according to the embodiment.

The present disclosure is not limited to the example described above or shown in drawings. The present disclosure may be arbitrarily modified or expanded without departing from the spirit of the invention.

Second Embodiment

Figure 5:
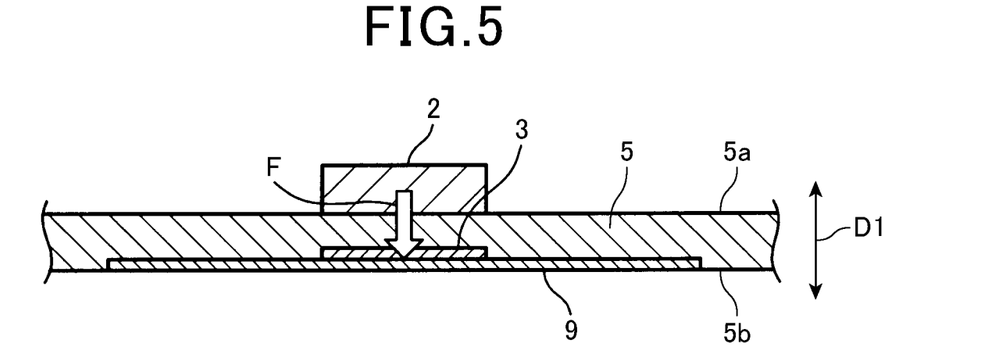
FIG. 5 is a schematic diagram of a mounting aspect of a transmission device according to a second embodiment to a substrate.

FIG. 5 shows a second embodiment. Although an example in which the ground pattern 9 is provided on the bottom surface 5b of the substrate 5 is given according to the first embodiment, the present disclosure is not limited thereto. As shown in FIG. 5, the ground pattern 9 may be provided such as to be embedded in the bottom surface 5b of the substrate 5. As a result of a configuration such as this as well, effects similar to those of the first embodiment can be achieved. The transmission device 1 can be reduced in size.

Third Embodiment

Figure 6:
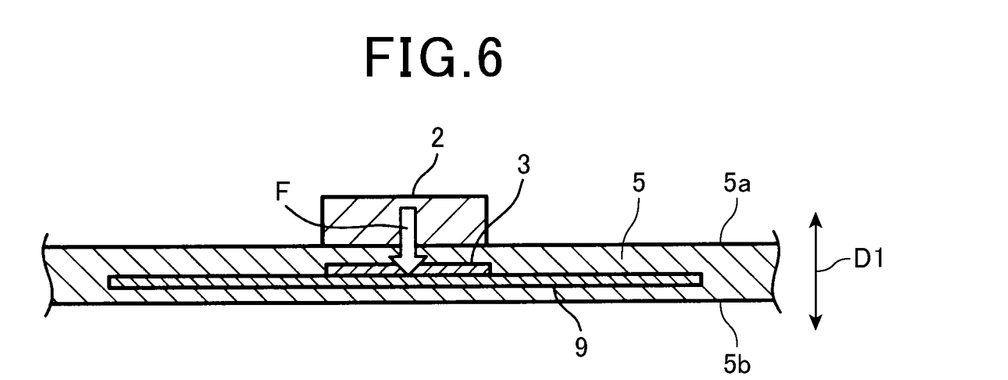
FIG. 6 is a schematic diagram of a mounting aspect of the transmission device according to a third embodiment to a substrate.

FIG. 6 shows a third embodiment. As shown in FIG. 6, the ground pattern 9 may be embedded inside the substrate 5. In this case as well, the flow of heat from the resistor element 2 to the heat flow sensor 3 can be promoted because the ground pattern 9 has higher heat conductivity than the substrate 5. Effects similar to those of the first embodiment can be achieved. The transmission device 1 can be reduced in size.

In addition, the state in which the substrate 5 is interposed between the resistor element 2 and the heat flow sensor 3 can include an aspect in which, for example, the resistor element 2 is mounted on the top surface 5a of the substrate 5 and the heat flow sensor 3 is mounted on the bottom surface 5b of the substrate 5. That is, the heat flow sensor 3 is not necessarily required to be embedded in the substrate 5 and may be mounted on the surface of the substrate 5.

In this case, for example, as a result of a so-called heat sink being provided, the metal component may be provided on the side opposite the resistor element 2. That is, in addition to the layer-like component such as the ground pattern 9 given as an example according to the embodiment, a block-shaped or fin-shaped component can also be used as the metal component as long as the component functions as a heat releasing component that releases heat from the heat flow sensor 3.

Fourth Embodiment

Figure 7:
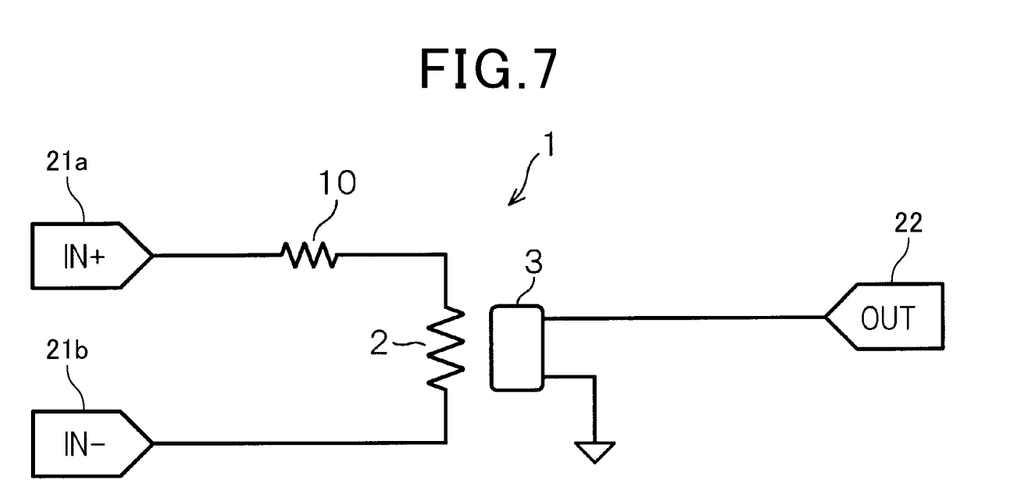
FIG. 7 is a schematic diagram of an electrical configuration of a transmission device according to a fourth embodiment.

FIG. 7 shows a fourth embodiment. According to the first embodiment, the inputted signal is presumed to be an alternating-current signal. However, the signal may also be a direct-current signal. In this case, for example, as shown in FIG. 7, a resistor element 10 is provided in series with the heat flow sensor 3, instead of the capacitor 4. As a result, a current based on the direct-current signal can be conducted to the resistor element 2. That is, the transmission device 1 shown in FIG. 7 transmits a signal by functioning as a direct-current-to-direct-current converting device. Therefore, effects similar to those of the first embodiment can be achieved. The transmission device 1 can be reduced in size. In this case, resistance values of the resistor element 2 and the resistor element 10 can be adjusted, and the resistor element 10 can be used as a current restricting resistor.

An example in which the heat flow sensor 3 is embedded inside the substrate 5 is given according to the first embodiment. However, the heat flow sensor 3 is not necessarily required to be provided inside the substrate 5. The heat flow sensor 3 may be mounted on the surface on the side opposite the surface on which the resistor element 2 is mounted. In this case as well, the signal can be transmitted in an isolated state by heat transfer.

What is claimed is:

1. An isolated signal transmission device that is provided in an electronic apparatus that comprises a programmable logic controller (PLC), the PLC including a connection terminal from which a signal is inputted and an internal circuit for the PLC, the isolated signal transmission device electrically isolating the signal inputted from the connection terminal and transmitting the inputted signal to the internal circuit, the isolated signal transmission device comprising:
    a resistor element that generates heat as a result of a current based on the inputted signal from the connection terminal being applied to the resistor element;
    a heat flow sensor that is provided to be electrically isolated from the resistor element, which detects an amount of heat flowing to the heat flow sensor itself when the resistor element generates heat, and outputs a signal based on the detected amount of heat to the internal circuit,
        wherein the resistor element serves as an input side of the transmission device and the heat flow sensor serves as an output side of the transmission device, the inputted signal from the connection terminal being transmitted through the heat flow sensor via heat conduction to the internal circuit;
    a substrate that is configured by an insulating material, the substrate contacting the resistor element and the heat flow sensor; and
    a metal component that is provided on a side opposite the resistor element with the heat flow sensor therebetween in a thickness direction of the substrate, the metal component being configured to lead heat flow from the resistor element toward the heat flow sensor,
    wherein the resistor element and the heat flow sensor are arranged to face each other in a thickness direction of the substrate.

2. The isolated signal transmission device according to claim 1, wherein:
    the resistor element is mounted on a surface of the substrate; and
    the heat flow sensor is embedded inside the substrate to correspond to a mounting position of the resistor element.

3. The isolated signal transmission device according to claim 1, wherein:
    the resistor element is a plurality of resistor elements;
    the heat flow sensor is a plurality of heat flow sensors; and
    a separation area that divides the metal component is provided to be positioned between adjacent heat flow sensors.

4. The isolated signal transmission device according to claim 3, wherein:
    the metal component is a ground pattern that is provided on the substrate.

5. The isolated signal transmission device according to claim 1, wherein:
    the metal component is a ground pattern that is provided on the substrate.

6. An electronic apparatus comprising:
    a programmable logic controller (PLC), wherein the PLC includes:
        a connection terminal from which a signal is inputted;
        an internal circuit for the PLC; and
        an isolated signal transmission device that electrically isolates the signal inputted from the connection terminal and transmits the inputted signal to the internal circuit, the isolated signal transmission device including
            a resistor element that generates heat as a result of a current based on the inputted signal from the connection terminal being applied to the resistor element; and
            a heat flow sensor that is provided to be electrically isolated from the resistor element, which detects an amount of heat flowing to the heat flow sensor itself when the resistor element generates heat, and outputs a signal based on the detected amount of heat to the internal circuit,
                wherein the resistor element serves as an input side of the transmission device and the heat flow sensor serves as an output side of the transmission device, the inputted signal from the connection terminal being transmitted through the heat flow sensor via heat conduction to the internal circuit;
            a substrate that is configured by an insulating material, the substrate contacting the resistor element and the heat flow sensor; and
            a metal component that is provided on a side opposite the resistor element with the heat flow sensor therebetween in a thickness direction of the substrate, the metal component being configured to lead heat flow from the resistor element toward the heat flow sensor,
            wherein the resistor element and the heat flow sensor are arranged to face each other in a thickness direction of the substrate.

* * * * *